(12) United States Patent
Loewenstein

(10) Patent No.: US 8,768,275 B2
(45) Date of Patent: Jul. 1, 2014

(54) SPECTRAL AVERAGING

(75) Inventor: Edward B. Loewenstein, Austin, TX (US)

(73) Assignee: National Instruments Corporation, Austin, TX (US)

( * ) Notice: Subject to any disclaimer, the term of this patent is extended or adjusted under 35 U.S.C. 154(b) by 78 days.

(21) Appl. No.: 13/293,352

(22) Filed: Nov. 10, 2011

(65) Prior Publication Data

US 2013/0122845 A1    May 16, 2013

(51) Int. Cl.
*H04B 17/00*    (2006.01)

(52) U.S. Cl.
USPC ............ 455/226.1; 455/67.11; 455/226.4; 375/134; 375/137; 375/326

(58) Field of Classification Search
USPC .............. 455/226.1–226.4, 67.11, 67.13; 375/134, 137, 140, 142, 150, 236, 326, 375/343
See application file for complete search history.

(56) References Cited

U.S. PATENT DOCUMENTS

| | | | |
|---|---|---|---|
| 3,876,946 A * | 4/1975 | La Clair et al. ............... 702/77 |
| 5,515,300 A * | 5/1996 | Pierce .......................... 702/190 |
| 5,982,763 A * | 11/1999 | Sato ............................. 370/342 |
| 6,292,775 B1 * | 9/2001 | Holmes ......................... 704/209 |
| 6,344,749 B1 | 2/2002 | Williams |
| 6,778,591 B2 | 8/2004 | Sato |
| 7,142,587 B2 * | 11/2006 | Sato ............................. 375/150 |
| 7,236,534 B1 | 6/2007 | Morejon et al. |
| 7,336,738 B2 * | 2/2008 | Wakamatsu ................. 375/343 |
| 7,460,591 B2 * | 12/2008 | Draving et al. ............. 375/226 |
| 7,738,574 B2 * | 6/2010 | Jang et al. .................... 375/260 |
| 8,018,589 B2 | 9/2011 | MacKinnon et al. |
| 2001/0036221 A1 * | 11/2001 | Sato ............................. 375/147 |
| 2003/0081700 A1 * | 5/2003 | Birru ............................ 375/340 |
| 2006/0165157 A1 * | 7/2006 | Griffin et al. ................ 375/147 |
| 2007/0160230 A1 * | 7/2007 | Nakagomi ..................... 381/97 |
| 2007/0242885 A1 * | 10/2007 | Yamaguchi et al. ......... 382/199 |
| 2008/0069270 A1 * | 3/2008 | Tyra et al. .................... 375/317 |
| 2009/0135419 A1 | 5/2009 | Finarov |
| 2011/0004047 A1 * | 1/2011 | Braspenning et al. ......... 600/27 |
| 2011/0007829 A1 * | 1/2011 | Kumar et al. ................. 375/260 |
| 2011/0013075 A1 * | 1/2011 | Kim et al. .................... 348/370 |
| 2011/0015931 A1 * | 1/2011 | Kawahara et al. ........... 704/264 |
| 2011/0093225 A1 | 4/2011 | Ramesh et al. |

* cited by examiner

*Primary Examiner* — Simon Nguyen
(74) *Attorney, Agent, or Firm* — Meyertons Hood Kivlin Kowert & Goetzel, P.C.; Jeffrey C. Hood

(57) ABSTRACT

Performing spectral analysis may include, for each of multiple acquisitions: a receiving a plurality of time-domain samples, cross-power spectrum analyzing first and second portions of the plurality of samples resulting in cross-power spectra, and accumulating a vector sum of the cross-power spectra including any cross-power spectra from previous acquisitions. Performing spectral analysis may also include calculating a vector average based on the accumulated vector sum and quantity of acquisitions. Performing spectral analysis may also include displaying the magnitude of the vector average.

20 Claims, 5 Drawing Sheets

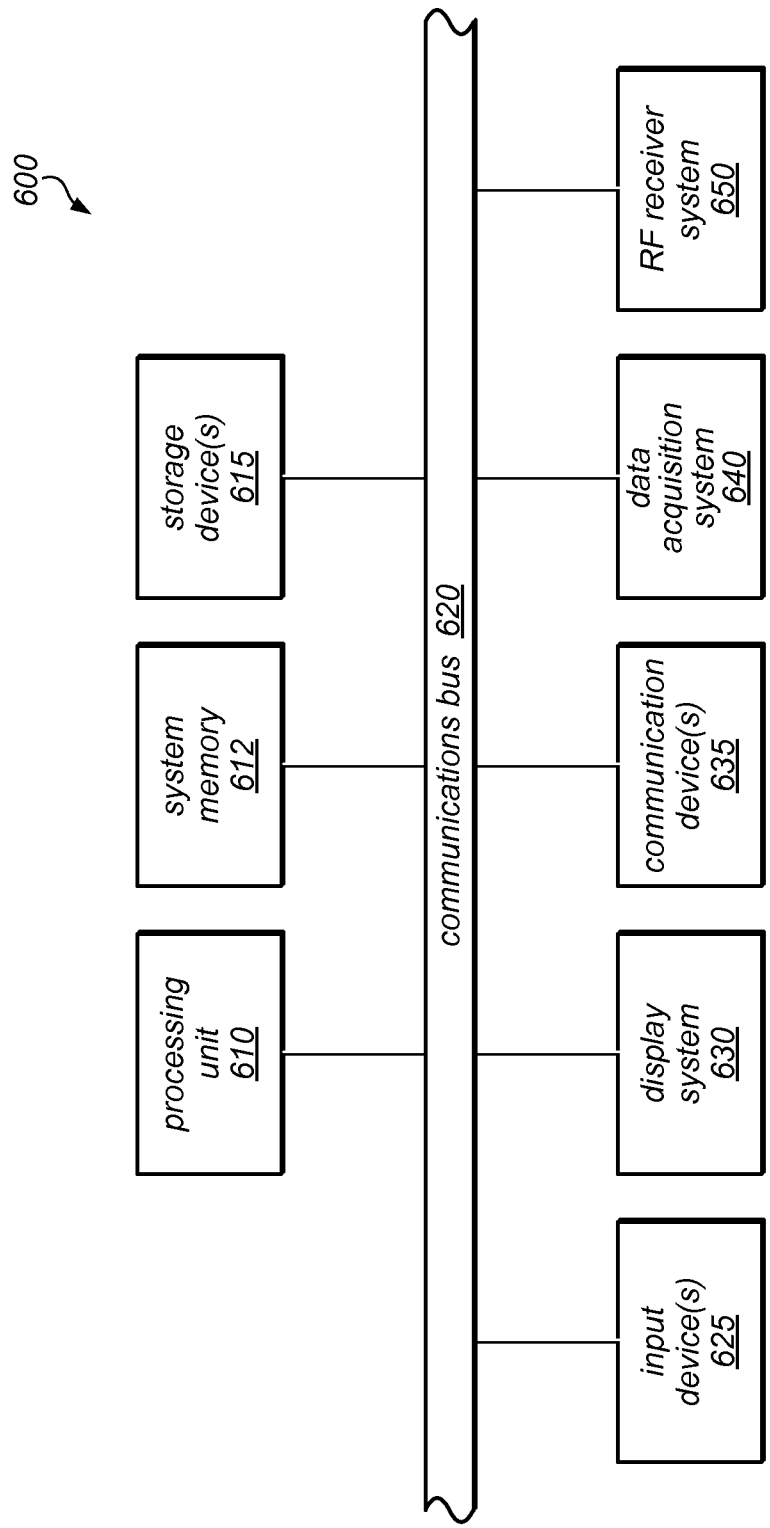

SPECTRAL AVERAGING

BACKGROUND

1. Technical Field

The present disclosure relates to the field of signal processing, and more specifically, to spectral analysis.

2. Description of the Related Art

Spectral analysis is the process of decomposing a signal into a spectrum to analyze the signal characteristics at different frequencies. Typical spectral measurements are limited in dynamic range by electrical noise and distortion, some of which may be caused by the measuring instrument itself. This can be especially problematic in radio frequency (RF) spectral analysis, where a trade-off is usually made between distortion and noise performance by varying the amount of signal attenuation at the input of the instrument, which in turn varies the actual signal level in the instrument. Many spectrum analyzers are inefficient at separating a signal from random noise, resulting in little separation between the signal to be examined and noise, even when displayed on a log scale (decibels). An example spectral analysis on a 40 kHz tone, at −100 dB, with added noise and digitized at 1 MS/s is illustrated in FIG. 1. As shown, the noise is indicated at a displayed floor of −100 dB, biasing the tone up by 3 dB. In other spectrum analyzers, slightly improved separation exists but significant power is lost by dropping both the signal and noise floor down by approximately 2.5 decibels (dB).

SUMMARY

This disclosure describes techniques and structures for performing a spectral analysis. In one embodiment, for each of multiple acquisitions: a plurality of time-domain samples may be received for a spectral measurement of a single-channel signal, first and second portions of the plurality of samples may be cross-power spectrum analyzed resulting in cross-power spectra, and a vector sum of the cross-power spectra may be accumulated including any cross-power spectra from previous acquisitions of the multiple acquisitions. In one embodiment, a vector average may be calculated based on the accumulated vector sum and quantity of acquisitions. In various embodiments, the magnitude of the vector average may be displayed. The magnitude of the vector average may then be used to analyze the signal.

BRIEF DESCRIPTION OF THE DRAWINGS

A better understanding of the disclosed embodiments can be obtained when the following detailed description of the preferred embodiments is considered in conjunction with the following drawings.

FIG. 6 illustrates one embodiment of a computer system that may be used to perform any of the various method embodiments disclosed herein.

Figure 1:
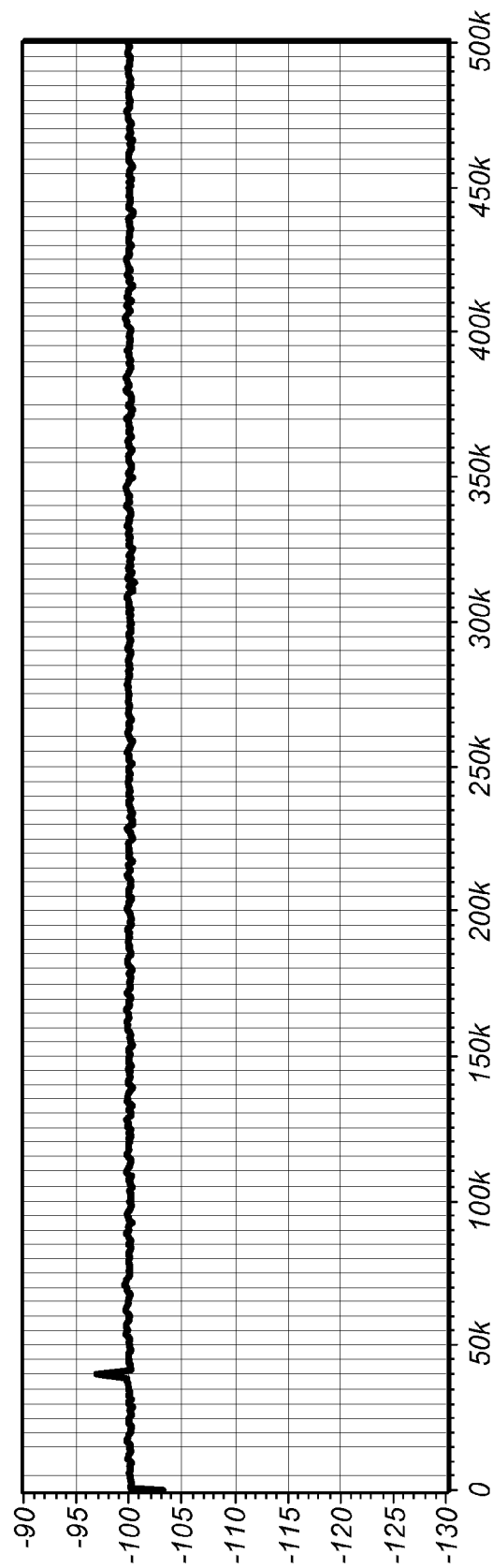
FIG. 1 is a spectrum analysis graph of a tone with added noise produced by a prior art spectral analyzer.

While the disclosure is susceptible to various modifications and alternative forms, specific embodiments thereof are shown by way of example in the drawings and are herein described in detail. It should be understood, however, that the drawings and detailed description thereto are not intended to limit the disclosure to the particular form disclosed, but on the contrary, the intention is to cover all modifications, equivalents and alternatives falling within the spirit and scope of the present disclosure as defined by the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, in a split array of time-domain samples of a signal used in one embodiment of the disclosed spectral analysis techniques, the terms "first" and "second" portions can be used to refer to either of the two portions of the array. In other words, the "first" and "second" portions are not limited to logical portions 0 and 1.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Memory Medium"—A memory medium is a medium configured for the storage and retrieval of information. Examples of memory media include: various kinds of semiconductor memory such as RAM and ROM; various kinds of magnetic media such as magnetic disk, tape, strip and film; various kinds of optical media such as CD-ROM and DVD-ROM; various media based on the storage of electrical charge and/or other physical quantities; media fabricated using various lithographic techniques; etc. The term "memory medium" may also include a set of two or more memory media which reside at different locations, e.g., at different computers that are connected over a network.

Programmable Hardware Element—a hardware device that includes multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning As used herein, the term "program" includes within its scope of meaning: 1) a software program which is stored in a memory and is executable by a processor, or, 2) a hardware configuration program useable for configuring a programmable hardware element. Any of the method embodiments described herein, or, any combination of the method embodiments described herein, or, any subset of any of the method embodiments described herein, or, any combination of such subsets may be implemented in terms of one or more programs.

Software Program—the term "software program" is intended to have the full breadth of its ordinary meaning, and includes any type of program instructions, code, script and/or data, or combinations thereof, that may be stored in a memory medium and executed by a processor or computer system. Exemplary software programs include: programs written in text-based programming languages such as C, C++, Java™, Pascal, Fortran, Perl, etc.; graphical programs (programs written in graphical programming languages); assembly language programs; programs that have been compiled to machine language; scripts; and other types of executable software. A software program may comprise two or more subprograms that interoperate in a specified manner.

Hardware Configuration Program—a program, e.g., a netlist or bit file, that can be used to program or configure a programmable hardware element.

Computer System—any of various types of computing or processing systems, including a personal computer (PC), a mainframe computer system, a workstation, a laptop, a network appliance, an Internet appliance, a hand-held or mobile device, a personal digital assistant (PDA), a television system, a grid computing system, or other device or combinations of devices. In general, the term "computer system" can be broadly defined to encompass any device (or combination of devices) having at least one processor that is configured to execute instructions that are stored on a memory medium.

Measurement Device—includes instruments, data acquisition devices, smart sensors and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card, a video capture board, a smart camera, a motion control device, a robot having machine vision, and other similar types of devices. Exemplary "stand-alone" instruments include oscilloscopes, multimeters, signal analyzers (e.g., spectral analyzers), signal demodulators, arbitrary waveform generators, spectroscopes, and similar measurement, test, or automation instruments.

* * *

In the following discussion, spectral averaging is disclosed that may lower random noise to arbitrarily low levels while preserving the signal to be measured (e.g., periodic signal). The disclosed spectral averaging may also improve displayed dynamic range. This disclosure first describes exemplary implementations, followed by a description of various embodiments of a spectral averaging technique.

Figure 2:
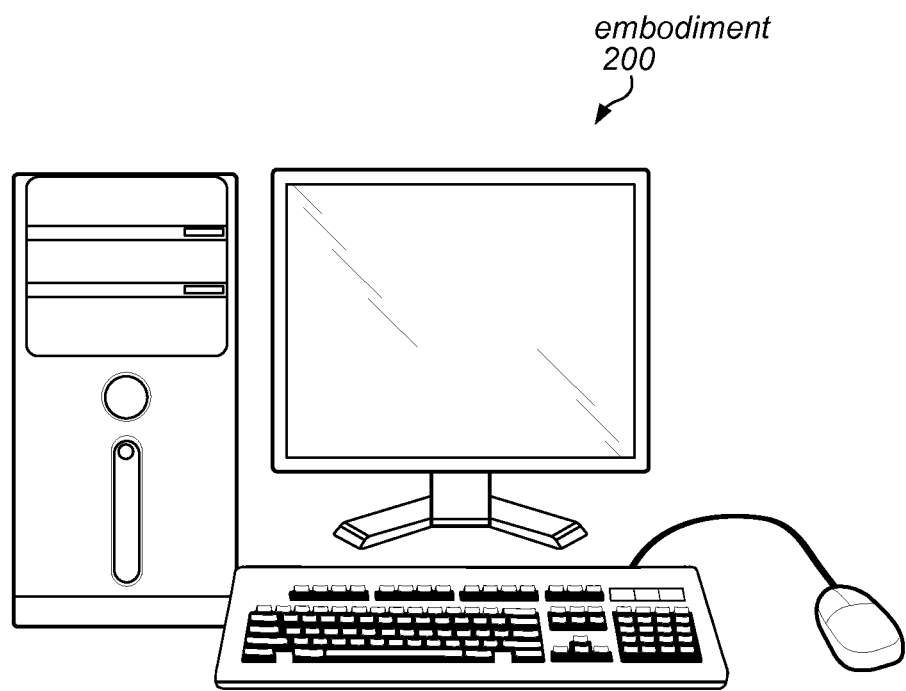
FIG. 2 illustrates an example computing device that may implement various disclosed spectral averaging techniques, according to some embodiments.

Turning now to FIG. 2, an exemplary computing device 200 is shown that may be configured to implement the spectral averaging techniques described herein. Computing device 200 may include a spectral analyzer. In some embodiments, computing device 200 may be the spectral analyzer. As shown, computing device 200 may be a computer. In other embodiments, computing device 200 may be a portable computer (e.g., laptop), personal digital assistant, tablet device, cellular telephone, or measuring instrument (e.g., oscilloscopes, multimeters, signal analyzers (e.g., spectral analyzers), signal demodulators, arbitrary waveform generators, spectroscopes, and similar measurement, test, or automation instruments), etc.

Moreover, the presently disclosed embodiments may be realized in any of various forms. For example, any of the various embodiments may be realized as a computer-implemented method, a computer-readable memory medium, or a computer system (e.g., computing device 200). Furthermore, any of the presently disclosed embodiments may be realized using one or more custom-designed hardware devices such as ASICs, DSPs, and/or using one or more programmable hardware elements such as FPGAs, and/or implemented as program instructions executed by a central processing unit (CPU).

A computer-readable memory medium is a memory medium that stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computer system may be configured to include a processor (or a set of processors) and a memory medium. The memory medium may be configured to store program instructions. The processor may be configured to read and execute the program instructions from the memory medium. The program instructions may be executable by the processor to implement a method, e.g., any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a measurement device, a computer on a card, an application-specific computer in a box, a server computer, a client computer, a hand-held device, a mobile computing device, a tablet computer, a wearable computer, etc.

In some embodiments, a set of computers distributed across a network may be configured to partition the effort of executing a computational method (e.g., any of the method embodiments disclosed herein).

Figure 3:
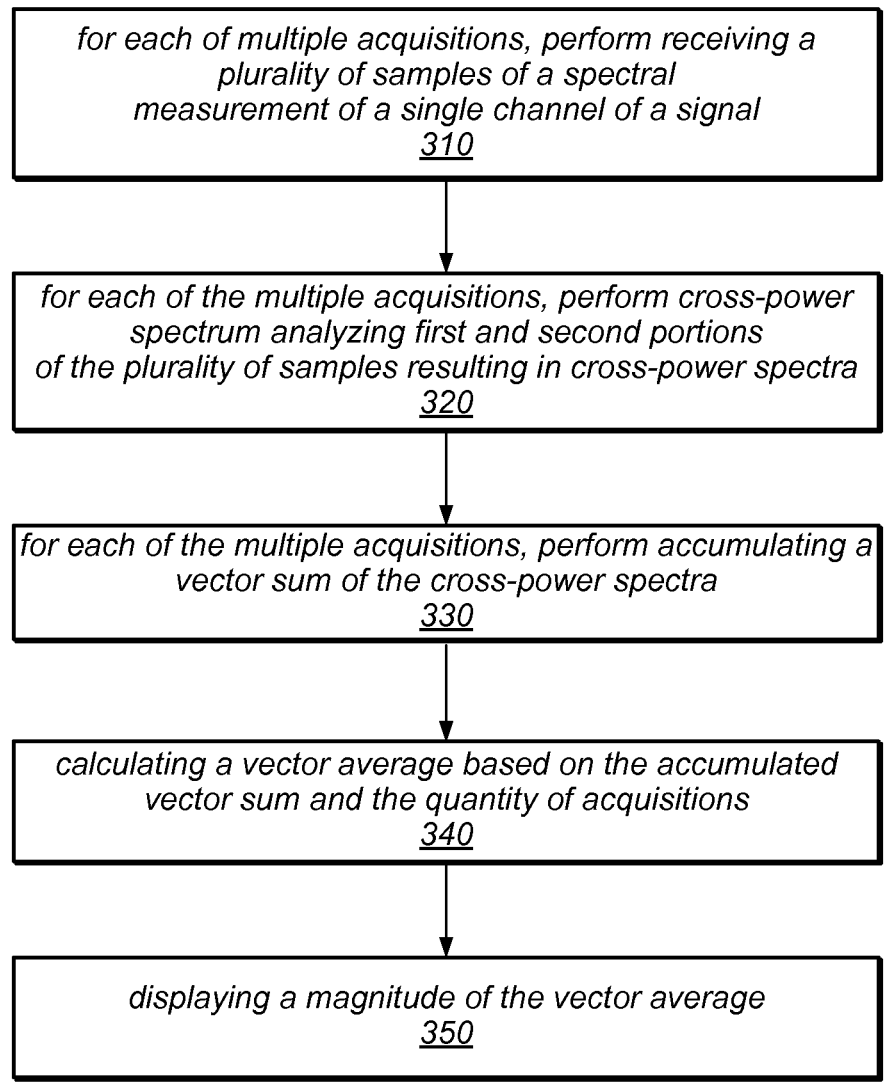
FIG. 3 is a flowchart illustrating one embodiment of a method for spectral averaging.

Turning now to FIG. 3, one embodiment for performing spectral averaging is shown. While the blocks are shown in a particular order for ease of understanding, other orders may be used. In some embodiments, the method of FIG. 3 may include additional (or fewer) blocks than shown.

At 310, for each of multiple acquisitions, a plurality of samples (e.g., time-domain samples) of a spectral measurement of a single channel of a signal may be received. In some embodiments, block 310 may also include the actual sampling of the signal in addition to receiving the samples. The plurality of received samples may be referred to as an acquired array of samples. The acquired array of samples, or split array, may include first and second portions. In some instances, the first and second portions may be of equal length such that each portion is half of the acquired array. The first and second portions may be separate time records of the same signal and may therefore be viewed as different, independent acquisitions of the same channel. The time records may be closely-spaced (e.g., consecutive, or from consecutive periods). In various embodiments, the beginnings of the first and second portions may be separated by a known, or predetermined, and consistent time difference. In some instances, the predetermined, consistent time difference between the start of the first portion and the start of the second portion may be equal to the time lengths of each of the first and second portion such that the entire, contiguous acquisition is twice the length of each portion. In other embodiments, the time separation between the two records comprising each acquisition pair may not be known and may be controlled to the extent that the time separation is approximately constant. Approximately constant is used herein to mean that slight variations in the time separation may occur such that the variations do not affect the measurement. In some instances, the first and second portions of the plurality of samples may overlap by at least one sample that is common to both the first and second portions. In such instances, there may not be complete independence of the noise components of the two portions. As a result, the noise may not be reduced arbitrarily and the reduction may depend on the time-domain window used in the processing.

In some embodiments, the number of acquisitions may be in the range of tens, hundreds, thousands, tens of thousands, or more. As described herein, a greater improvement in the noise floor may result from performing more acquisitions.

The signal from which the samples have been taken may be a stationary signal (e.g., random noise), a periodic signal (e.g., sine waves), or a signal whose properties do not change fundamentally over time. In some embodiments, as detailed herein, the signal may be a repeated pseudo-random sequence with a known period. In some embodiments, the signal may be a repeatable short-term or burst waveform. In some embodiments, the signal may have a period that is significantly shorter than each acquisition time. Because the time separation may be the same in each acquisition pair, it may not be necessary for the time separation to be an integer number of periods of the waveform(s), for example, in situations in which several periods are captured in each record. In certain situations, in order to avoid the need to separate the beginning times of the two portions by an exact integer number of periods of the target signal, the number of periods to be captured in a single portion may be a function of the time-domain window used before the cross-power spectrum is computed. Some example common windows may include at least 5 to 10 periods.

In various embodiments, the number of samples received (and for embodiments in which the actual sampling is performed, the number of samples taken) may be double the number of samples in an individual acquisition than is used in a typical scalar analysis. The acquired array of samples may then be split into two halves.

In some embodiments, the time separation between the two records that constitute each acquisition pair may be known while in other embodiments, the time separation may not be known. In some cases in which a periodic signal is the signal from which samples are taken, the period of the signal may be shorter than each acquisition time. In such cases, the time separation may be the same (e.g,. approximately constant) in each pair allowing flexibility to capture several periods in each record.

In various embodiments, the signal being sampled may be a repeating signal with a period long enough such that ensuring that the acquisition time is longer than the period may be inconvenient. One example of such a signal is a pseudo random bit sequence (PRBS). In such embodiments, the time between the beginnings of two acquisitions can be set to be an integer multiple of the signal's period. In addition to acquiring at least two times the number of samples as would be acquired in a scalar analysis, in some embodiments, an integer multiple of a signal periods' worth of samples greater than would be acquired in scalar analysis may be acquired. Two arrays may be extracted from the acquired samples, with the beginning of each array being separated by that integer number of signal periods. Such an acquisition may allow for a flat top on the PRBS.

As shown at 320, for each of the multiple acquisitions, first and second portions of the plurality of samples may be cross-power spectrum analyzed resulting in cross-power spectra. For example, the first and second portions may be the two halves of the acquired array of samples. Accordingly, cross-power spectrum analysis may be performed on the two portions. In some embodiments, the two portions may be windowed or otherwise processed before cross-power spectrum analysis is performed. For example, in Fourier spectrum analysis, the time-domain data may be multiplied by a window function in order to localize spectral information. This may reduce leakage of spectral power among the frequency bins at large and concentrates the leakage in the bins that are closest to their true frequency. This may yield an improved dynamic range in general at the expense of wider main lobes where spectral power is concentrated (e.g., at sine waves). In the time domain, this may be implemented as a smooth function which tapers to zero at the beginning and end of the time record and reaches a maximum value in the middle of time record. Because a finite-time Fourier transform may treat the time record as a repeating loop, the tapering to zero at the endpoints may suppress potential discontinuities in the resulting waveform which could come about when the two endpoints in the time record have different values. In an embodiment in which a constant offset between the start times of the portions is used, the resulting vectors from the cross-power spectrum analysis may have the same angle.

As illustrated at 330, for each of multiple acquisitions, the vector sum of the cross-power spectra may be accumulated. For instance, the vector sum may be accumulated for crosspower spectra for the current acquisition and any previous acquisitions. Therefore, the accumulated vector sum may be seen as a running sum that takes into account previous acquisitions as well as the current acquisition. The vector sum accumulation may be an iterative process in that blocks 310, 320, and 330 may be repeated for the plurality of samples from each acquisition. The accumulated vector sums from previous accumulations may be stored such that block 340 may determine a vector average based on the stored accumulated vector sum.

At 340, a vector average may be calculated based on the accumulated vector sum. In some embodiments, calculating the vector average may include dividing the accumulated vector sum by the quantity/number of acquisitions. The quantity of acquisitions may be a total of all the acquisitions of block 310. For example, if 10 arrays of samples are acquired, then the number of acquisitions is 10. The calculated vector average may be stored or may be provided to a display for displaying the magnitude of the vector average, as described at 350. In one embodiment, the magnitude of the vector average may also be calculated at 340 before storing or providing it for display. In some embodiments, the calculated vector average may be otherwise processed. For example, the calculated vector average may be scaled before the magnitude is calculated or provided for display.

Figure 5:
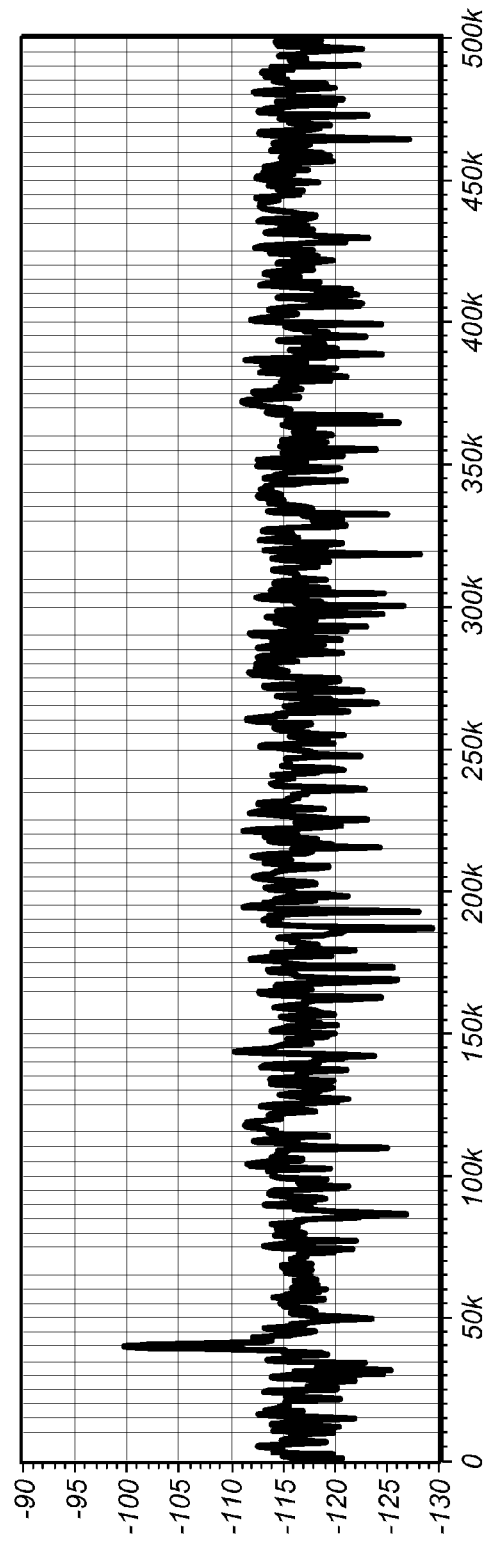
FIG. 5 is a spectrum analysis graph of a tone with added noise produced by a spectral analyzer implementing spectral averaging, according to some embodiments.

At 350, the calculated vector average may be provided to a display for displaying the magnitude of the vector average. One example of a displayed magnitude of the vector average can be seen in FIG. 5. FIG. 5 illustrates a spectrum analysis graph of a tone with added noise produced by a spectral analyzer implementing the disclosed spectral averaging, according to some embodiments. The tone in this example was a 40 kHz tone, at −100 dB, with added noise and digitized at 1 MS/s. The illustrated example was produced by averaging 1000 acquisitions. As shown, the indicated noise floor is reduced by 15 dB and the tone is correctly displayed at −100 dB. Thus, in this example, power is preserved and improved displayed dynamic range is achieved. The improvement can be seen more clearly when compared with FIG. 1. Note that the source waveforms used in examples of FIGS. 1 and 5 were identical. In FIG. 1, the noise is indicated at a displayed floor of −100 dB, with the tone biased up by 3 dB. In contrast, in FIG. 5, the tone is displayed correctly with a significant reduction in the noise floor.

Turning back to FIG. 3, one or more of blocks 310-350 may be repeated such that the spectral average is calculated and/or displayed multiple times. For instance, blocks 340 and 350 may also be performed for each acquisition or they may be performed at every n acquisition. In such an instance, an intermediate vector average may be calculated and the magnitude of the intermediate vector average may be displayed.

In various embodiments, displayed dynamic range may be improved with each subsequent acquisition and resulting updated accumulated vector sum and vector average. As an example, approximately a 5 dB improvement in the noise floor (and thus, dynamic range) may be achieved by taking a vector average based on 10 acquisition/accumulation iterations. Each approximate 5 dB improvement may be achieved by taking an average based on approximately 10 times the number of acquisitions. Thus, as one example, approximate 10 dB, 15 dB, and 20 dB improvements in the noise floor may be achieved by calculation an averaged based on taking 100, 1000, and 10,000 acquisitions, respectively.

By performing the disclosed spectral averaging, improved displayed dynamic range may be achieved. This may allow for greater separation of periodic signals from random signals (e.g., noise) by vector-averaging the random signal away yet keeping the periodic signals undisturbed. In certain instances, the disclosed techniques may, for inter-modulation and distortion, allow instruments to get past their own noise floor. Moreover, the disclosed techniques may improve dealing with spectral regrowth. For example, the effect of instrument noise that may mask spectral regrowth may be reduced according to the disclosed techniques. Then, input levels could be modified accordingly to prevent adding to the spectral regrowth.

Figure 4:
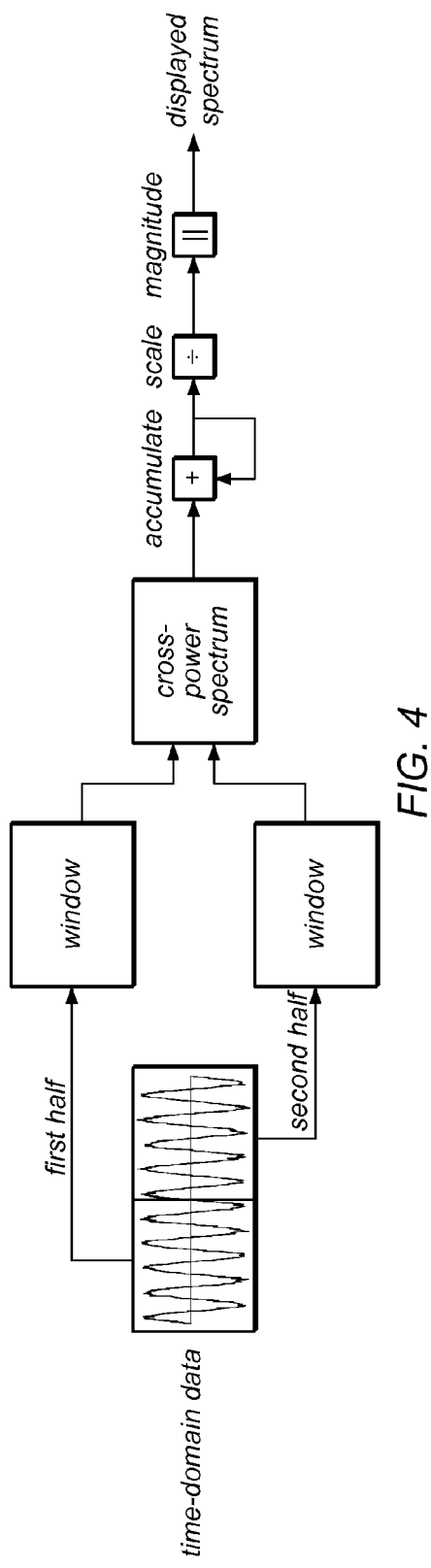
FIG. 4 is a block diagram of one embodiment of the disclosed spectral averaging technique.

Turning now to FIG. 4, a block diagram of one embodiment of the disclosed spectral averaging technique is shown. As shown, time-domain data may be received. The illustrated time-domain data is from a single channel of a periodic signal. The periodic signal may be divided into first and second portions (e.g., first half and second half) that may, in some embodiments, be windowed before cross spectrum analysis is performed. The cross-power spectra may be accumulated as a vector sum. As shown, accumulations may be performed for multiple acquisitions. For example, after the first and second portions from one acquisition cycle have been cross-power spectrum analyzed and accumulated, a next acquisition may occur such that other time-domain data (e.g., from the same single channel of the same periodic signal) may be processed, split, cross-power spectrum analyzed, and accumulated. The result may be a running accumulation of the vector sum which, in some instances, may be scaled, may have its magnitude computed, and may be provided to a display for displaying the spectrum.

FIG. 6 illustrates one embodiment of a computer system 600 that may be used to perform any of the method embodiments described herein, or, any combination of the method embodiments described herein, or any subset of any of the method embodiments described herein, or, any combination of such subsets.

Computer system 600 may include a processing unit 610, a system memory 612, a set 615 of one or more storage devices, a communication bus 620, a set 625 of input devices, and a display system 630.

System memory 612 may include a set of semiconductor devices such as RAM devices (and perhaps also a set of ROM devices).

Storage devices 615 may include any of various storage devices such as one or more memory media and/or memory access devices. For example, storage devices 615 may include devices such as a CD/DVD-ROM drive, a hard disk, a magnetic disk drive, magnetic tape drives, etc.

Processing unit 610 is configured to read and execute program instructions, e.g., program instructions stored in system memory 612 and/or on one or more of the storage devices 615. Processing unit 610 may couple to system memory 612 through communication bus 620 (or through a system of interconnected busses). The program instructions configure the computer system 600 to implement a method, e.g., any of the method embodiments described herein, or, any combination of the method embodiments described herein, or, any subset of any of the method embodiments described herein, or any combination of such subsets. Processing unit 610 may include one or more processors (e.g., microprocessors).

One or more users may supply input to the computer system 600 through the input devices 625. Input devices 625 may include devices such as a keyboard, a mouse, a touch-sensitive pad, a touch-sensitive screen, a drawing pad, a track ball, a light pen, a data glove, eye orientation and/or head orientation sensors, a microphone (or set of microphones), or any combination thereof The display system 630 may include any of a wide variety of display devices representing any of a wide variety of display technologies. For example, the display system may be a computer monitor, a head-mounted display, a projector system, a volumetric display, or a combination thereof. In some embodiments, the display system may include a plurality of display devices. In one embodiment, the display system may include a printer and/or a plotter.

In some embodiments, the computer system 600 may include other devices, e.g., devices such as one or more graphics accelerators, one or more speakers, a sound card, a video camera and a video card.

In some embodiments, computer system 600 may include one or more communication devices 635, e.g., a network interface card for interfacing with a computer network. In one embodiment, computer system 600 may receive an input signal and perform signal processing operations on the modulated signal using such a communication device.

In some embodiments, the communication devices may include a reconfigurable I/O (RIO) board that includes one or more programmable hardware elements (PHEs), one or more A/D converters and additional circuitry. The RIO board may be programmable to achieve a user-desired configuration of input and/or output processing, e.g., via a program written using LabVIEW FPGA. In some embodiments, the additional circuitry of the RIO board may include circuitry optimized for various kinds of signal processing operations and/or circuitry configured for spectral analysis. In some embodiments, the reconfigurable I/O board is one of the RIO boards provided by National Instrument Corporation.

The computer system may be configured with a software infrastructure including an operating system, and perhaps also, one or more graphics APIs (such as OpenGL®, Direct3D, Java 3D™). In some embodiments, the software infrastructure may include LabVIEW and/or LabVIEW FPGA, which are software products of National Instruments Corporation.

In some embodiments, the computer system 600 may be configured for coupling to a data acquisition system 640. The data acquisition system 640 may be configured to receive analog inputs signals, to digitize the analog input signals, and to make those digitized signals available to the computer system 600. The data acquisition system 640 may operate under the control of the software executing on processor 610. In some embodiments, data acquisition system 640 may include one or more A/D converters that are configured to capture samples of an input signal. The captured samples may be stored into a memory of data acquisition system 640 and may be made available for access by host software executing on processing unit 610.

In some embodiments, the computer system 600 may be configured to interface with a receiver system 650, e.g., an off-the-shelf receiver system designed for capturing radiated electromagnetic signals (such as RF signals, wireless LAN signals, etc.), down-converting the captured signals, and sampling the down-converted signals. In one embodiment, the receiver system 650 may be realized by a vector signal analyzer such as the NI PXIe-5663 or the NI PXIe-5663E provided by National Instruments Corporation.

FIG. 2 illustrates one possible embodiment 200 for computer system 600.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for recovering a periodic signal from a random signal, comprising:
for each of multiple acquisitions:
receiving a plurality of time-domain samples of a single-channel signal;
cross-power spectrum analyzing first and second portions of the plurality of samples to obtain a cross-power spectrum between the first and second portions; and
accumulating the cross-power spectrum into a cumulative cross-power spectrum using a vector sum of the cross-power spectrum and the cumulative cross-power spectrum;
calculating a vector average cross-power spectrum based on the cumulative cross-power spectrum and the quantity of acquisitions; and
displaying a magnitude function corresponding to the vector average cross-power spectrum.

2. The method of claim 1, wherein a beginning time of the first portion of the plurality of samples is separated from a beginning time of the second portion of the plurality of samples by a predetermined, consistent time difference.

3. The method of claim 2, wherein the predetermined, consistent time difference is equal to a time length of the first portion, wherein the time length of the first portion is equal to a time length of the second portion.

4. The method of claim 1, wherein the first and second portions of the plurality of samples overlap by at least one sample that is common to both the first and second portions.

5. The method of claim 1, wherein the plurality of samples used in said cross-power spectrum analyzing includes at least twice a number of samples than used in a scalar spectral analysis.

6. The method of claim 1, wherein the plurality of samples includes at least an integer multiple of the periodic signal's period worth of samples greater than a number of samples used in a scalar spectral analysis, and wherein the plurality of samples is also at least twice a number of samples used in a scalar spectral analysis.

7. The method of claim 6, wherein a beginning of the first portion is separated from a beginning of the second portion by an integer multiple of the periodic signal's period.

8. The method of claim 6, wherein the periodic signal to be recovered from the random signal is a repeated pseudo-random sequence with a known period.

9. The method of claim 1, further comprising:
for each of the multiple acquisitions, calculating an intermediate vector average based on the cumulative cross-power spectrum, and displaying the magnitude of the intermediate vector average.

10. A non-transitory computer-readable storage medium storing program instructions, wherein the program instructions are computer-executable to implement:
for each of multiple acquisitions:
receiving a plurality of time-domain samples of a single-channel signal;
cross-power spectrum analyzing first and second portions of the plurality of samples to obtain a cross-power spectrum between the first and second portions; and
accumulating the cross-power spectrum into a cumulative cross-power spectrum using a vector sum of the cross-power spectrum and the cumulative cross-power spectrum;

calculating a vector average cross-power spectrum based on the cumulative cross-power spectrum and the quantity of acquisitions; and displaying a magnitude function corresponding to the vector average cross-power spectrum.

11. The non-transitory computer-readable storage medium of claim 10, wherein a beginning of the first portion is separated from a beginning of the second portion by a predetermined time difference.

12. The non-transitory computer-readable storage medium of claim 11, wherein the predetermined time difference is equal to a length of the first portion, wherein the length of the first portion is equal to a length of the second portion.

13. The non-transitory computer-readable storage medium of claim 10, wherein the first and second portions of the plurality of samples overlap by at least one sample that is common to both the first and second portions.

14. The non-transitory computer-readable storage medium of claim 10, wherein a beginning of the first portion is separated from a beginning of the second portion by an integer multiple of a periodic signal's period.

15. The non-transitory computer-readable storage medium of claim 10, wherein the plurality of samples used in said cross-power spectrum analyzing includes at least twice a number of samples than used in a scalar spectral analysis.

16. A system, comprising:
at least one processor; and
a memory storing program instructions, wherein the program instructions are executable by the at least one processor to:
for each of multiple acquisitions:
receive a plurality of time-domain samples of a single-channel signal;
cross-power spectrum analyze first and second portions of the plurality of samples to obtain a cross-power spectrum between the first and second portions; and
accumulate the cross-power spectrum into a cumulative cross-power spectrum using a vector sum of the cross-power spectrum and the cumulative cross-power spectrum;
calculate a vector average cross-power spectrum based on the cumulative crosspower spectrum and the quantity of acquisitions; and
display a magnitude function corresponding to the vector average cross-power spectrum.

17. The system of claim 16, wherein a start of the first portion is separated from a start of the second portion by a predetermined time difference.

18. The system of claim 17, wherein the predetermined time difference is equal to a length of the first portion, wherein the length of the first portion is equal to a length of the second portion.

19. The system of claim 16, wherein the first and second portions of the plurality of samples overlap by at least one sample that is common to both the first and second portions.

20. The system of claim 16, wherein a beginning of the first portion is separated from a beginning of the second portion by an integer multiple of a periodic signal's period.

* * * * *

UNITED STATES PATENT AND TRADEMARK OFFICE
CERTIFICATE OF CORRECTION

| | | |
|---|---|---|
| PATENT NO. | : 8,768,275 B2 | Page 1 of 1 |
| APPLICATION NO. | : 13/293352 | |
| DATED | : July 1, 2014 | |
| INVENTOR(S) | : Loewenstein | |

It is certified that error appears in the above-identified patent and that said Letters Patent is hereby corrected as shown below:

In the Claims:

Claim 16, Column 12, Line 13, please delete "crosspower" and substitute -- cross-power --.

Signed and Sealed this
Second Day of September, 2014

Michelle K. Lee
*Deputy Director of the United States Patent and Trademark Office*